(12) United States Patent
Hoshi et al.

(10) Patent No.: US 8,508,247 B2
(45) Date of Patent: Aug. 13, 2013

(54) ELECTRICAL CONNECTING APPARATUS

(75) Inventors: Katsuji Hoshi, Aomori (JP); Akihisa Akahira, Aomori (JP); Yoshinori Kikuchi, Aomori (JP)

(73) Assignee: Kabushiki Kaisha Nihon Micronics, Tokyo (JP)

( * ) Notice: Subject to any disclaimer, the term of this patent is extended or adjusted under 35 U.S.C. 154(b) by 618 days.

(21) Appl. No.: 12/698,058

(22) Filed: Feb. 1, 2010

(65) Prior Publication Data

US 2010/0194416 A1   Aug. 5, 2010

(30) Foreign Application Priority Data

Feb. 2, 2009   (JP) ................................. 2009-021589

(51) Int. Cl.
*G01R 31/20*   (2006.01)
(52) U.S. Cl.
USPC ............ 324/754.08; 324/755.07; 324/756.03; 324/756.07; 439/66
(58) Field of Classification Search
USPC ............. 324/754.07, 754.08, 756.03, 756.07; 439/66
See application file for complete search history.

(56) References Cited

U.S. PATENT DOCUMENTS

| 5,969,533 | A | * | 10/1999 | Takagi ...................... 324/754.07 |
| 6,255,126 | B1 | * | 7/2001 | Mathieu et al. .................. 438/15 |
| 7,256,592 | B2 | * | 8/2007 | Hosaka et al. ............ 324/755.01 |
| 7,474,111 | B2 | * | 1/2009 | Narita ...................... 324/756.03 |
| 2004/0113640 | A1 | * | 6/2004 | Cooper et al. ................ 324/754 |
| 2006/0114008 | A1 | * | 6/2006 | Fujii ............................. 324/754 |
| 2006/0171425 | A1 | * | 8/2006 | Lee et al. .......................... 372/1 |
| 2008/0111571 | A1 | * | 5/2008 | Smith et al. .................... 324/754 |
| 2008/0186041 | A1 | * | 8/2008 | Lee ................................. 324/762 |
| 2009/0237100 | A1 |   | 9/2009 | Namiki et al. |

FOREIGN PATENT DOCUMENTS

| JP | 2006148042 | 6/2006 |
| JP | 2006-210473 | 8/2006 |
| JP | 2007-500945 | 1/2007 |
| JP | 2008-145238 | 6/2008 |
| WO | 2005013332 | 2/2005 |
| WO | 2007057990 | 5/2007 |

* cited by examiner

*Primary Examiner* — Arleen M Vazquez
(74) *Attorney, Agent, or Firm* — Bryan A. Santarelli; Graybeal Jackson LLP

(57) ABSTRACT

An embodiment of an electrical connecting apparatus comprises a probe base plate and a plurality of contacts provided with tips to be pressed against electrodes of a device under test and arranged on the underside of the probe base plate. The distance dimensions from an imaginary plane parallel to the probe base plate to the tips of the contacts are made the greater toward the center of the probe base plate.

19 Claims, 8 Drawing Sheets

(A)

(B)

ELECTRICAL CONNECTING APPARATUS

PRIORITY CLAIM

The instant application claims priority to Japanese Patent Application No. 2009-021589, filed Feb. 2, 2009, which application is incorporated herein by reference in its entirety.

TECHNICAL FIELD

An embodiment of the disclosed subject matter relates to an electrical connecting apparatus for use in electrical test of a flat plate-like device under test such as an integrated circuit.

BACKGROUND

An integrated circuit formed in a semiconductor wafer is generally subjected to an electrical test (i.e., to check the quality of the integrated circuit) as to whether or not it has predetermined electrical characteristics). Such a test may be performed for all integrated circuits in one wafer at one time or at separate times by using an electrical connecting apparatus such as a probe card which electrically connects an electrode of the integrated circuit with an electric circuit of a test apparatus.

The connecting apparatus to be used for such a test may include a wiring board having a plurality of connecting portions to be electrically connected to the electric circuit of the test apparatus, a probe base plate having a plurality of internal wires on the underside of the wiring board and electrically connected to the connecting portion, and a plurality of contacts (i.e., probes) attached to the underside of the probe base plate and electrically connected to the internal wires. This connecting apparatus may be mounted on the test apparatus or on the outer peripheral portion of a reinforcing member attached to the upside of the wiring board.

In the above-mentioned connecting apparatus, the tip of each contact is pressed against an electrode of the integrated circuit to be elastically deformed and is able to slide on the electrode of the integrated circuit. Thus, an oxide film formed on the surface of the electrode of the integrated circuit may be scraped off by the tip, so that the contact and the electrode of the integrated circuit are brought into good electrical contact. In this state, electrical signals for the test between the contact and the integrated circuit are transmitted.

With the recent tendency of larger-sized wafers, those having a diameter larger than 300 mm are being manufactured. For testing such a larger-sized wafer, demand for a larger-sized connecting apparatus for a larger number of integrated circuits to be tested simultaneously at one time is growing. Thus, probe base plates tend to be more and more larger-sized, with more contacts attached to a probe base plate, thereby enabling the test more integrated circuits simultaneously.

Nowadays, wafers having a diameter larger than 300 mm are manufactured, and the diameters of a wiring board and a probe base plate of an electrical connecting apparatus to be used for testing integrated circuits of such a wafer may be over 400 mm.

In view of the above, for the purpose of stabilizing a state of electrical connection (i.e., conductivity) between a contact and an electrode of an integrated circuit, there is proposed a technology to flatten the probe base plate to make uniform the heights of the tips of the contacts relative to the integrated circuit, a technology to forcibly prevent the probe base plate from bending, which may occur when the tips of the contacts are pressed against the electrodes of the integrated circuits, and the like. Examples of these technologies are shown generally in JP Patent Appln. Public Disclosure No. 2006-210473 and JP Patent Appln. Public Disclosure No. 2007-500945, which are incorporated by reference.

However, because of the tendency of a probe base plate to become larger and to include an increased number of contacts attached to the probe base plate, it happens that, the higher the number of contacts, the larger the pressing force (total pressing force) of an entire connecting apparatus becomes. For instance, in case where a 5 g pressing force is specified per contact, the total pressing force of the entire connecting apparatus with 20,000 contacts is approximately 100 kg. Also, when the pressing force acts on a probe base plate, the rim portion of the probe base plate is kept under restraint by a card holder, but the central portion may be free to move.

Therefore, according to the foregoing, the probe base plate may be largely bent such that the central portion is convex upward due to deflection of composing elements such as the wiring board and probe base plate when the tips of the contacts are pressed against the electrodes of the integrated circuit.

When the probe base plate bends as mentioned above, the height positions of the contacts (i.e., the probe tips) relative to the integrated circuits may become greatly different between the contacts located in the center of the probe base plate and the contacts located along the side of the rim of the probe base plate. This may cause a great difference in the amount of slide of the tips from tip to tip relative to the electrodes of the integrated circuit when the tips of the contacts are pressed against the electrodes of the integrated circuit.

In a connecting apparatus such as above, there may be contacts that cannot obtain a desired amount of slide, contacts whose tips are not sufficiently pressed against the electrode of the integrated circuits, and the like, when being tested. In such a case, it may be difficult or impossible to attach the connecting apparatus to the test apparatus and to confirm accurately a contact position, which may be marked by the distance of the scrape of the electrode by the contact, so that an accurate test may not be obtained.

SUMMARY

An electrical connecting apparatus according to an embodiment reduces differences between distances from a device under test and probe tips even when a probe base plate is bent with the central portion being convex, for example convex upward.

In an embodiment, the electrical connecting apparatus comprises a probe base plate, and a plurality of contacts having tips to be pressed against electrodes of the device under test and arranged on the underside of the probe base plate. The distances from an imaginary plane within the probe base plate parallel to the probe base plate to the tips may be greater toward the center of the probe base plate.

The plural contacts may be located in any one of a plurality of regions extending concentrically about the center, and the distances between the contacts and the center may be increased toward the contacts in the region nearer the center.

The plural regions may include a first region located nearest to the center, and a second region around the outside of the first region, and where the radius of the outermost region is R, the first and the second regions may, respectively, cover the ranges from the center to R/2 and from R/2 to R.

In an embodiment where when the plural regions include the first region nearest to the center, the second region around the outside of the first region, and a third region around the outside of the second region, and where the radius of the outermost region is R, the first region may cover the range from the center to R/3, the second region may cover the range from R/3 to 2R/3, and the third region may cover the range from 2R/3 to R, respectively.

The nearer the contacts to the center, the greater the dimensions of the contacts between the attachment positions of the regions to the probe base plate and their tips may be made.

The probe base plate may have on the underside thereof a plurality of probe lands to which the contacts are attached, and the nearer the probe lands to the center, the thicker the dimensions of the probe lands may be made.

The probe base plate may have on the underside a plurality of probe lands to which the contacts are attached, and the nearer the probe lands to the center, the thicker the probe lands may be made, and the nearer the contacts to the center, the larger the dimensions of the contacts between the attached positions of the contacts to the tips may be made.

The radius dimension of the region located in the outermost circumference may be 200 mm or over. Also, each contact may be cantilevered on the probe base plate.

Each contact may include: an attachment region to be attached to the probe base plate in a state of extending downward from the probe base plate, an arm region to extend in a direction to intersect the extending direction of the attachment region from the lower end of the attachment region, and a tip region to extend downward from the front end portion of the arm region. The tip may be the lower end of the tip region.

The height positions from the imaginary plane under the tips to the tips may be lowered gradually or step-wise toward the center of the probe base plate. For this reason, when the probe base plate is greatly curved such that the central portion becomes convex upward, the nearer the contacts are positioned to the center, the more upward they are displaced, making the differences in distance from the device under test to the tips smaller.

As a result of an above embodiment, the tips of the contacts may be better pressed against the electrodes of the device under test, and the differences in the amount of slide of the device under test relative to the electrodes may be significantly reduced. Thus, it may be possible to accurately confirm the contact positions that mark the scrapes made when the connecting apparatus is attached to the test apparatus, thereby enabling a test to be conducted more accurately.

DETAILED DESCRIPTION

Figure 1:
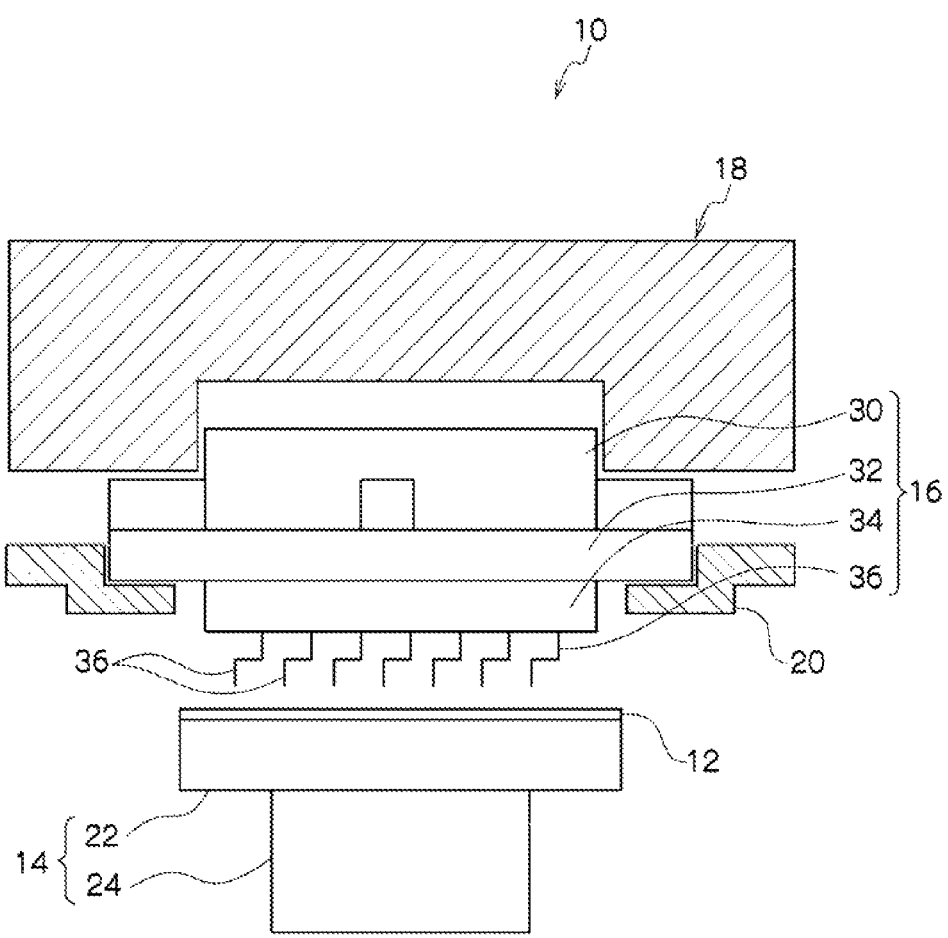
FIG. 1 shows an embodiment of a test apparatus using an embodiment of an electrical connecting apparatus.

Referring to FIG. 1, an embodiment of a test apparatus 10 is used for testing a plurality of integrated circuits, which are formed in a semiconductor wafer 12, as flat plate-like devices under test. Signals for a test include an electrical signal (voltage, current) to be supplied to the wafer 12 (particularly, integrated circuits) and a response signal from the wafer 12 (particularly, integrated circuits) to the electrical signal.

Figure 2:
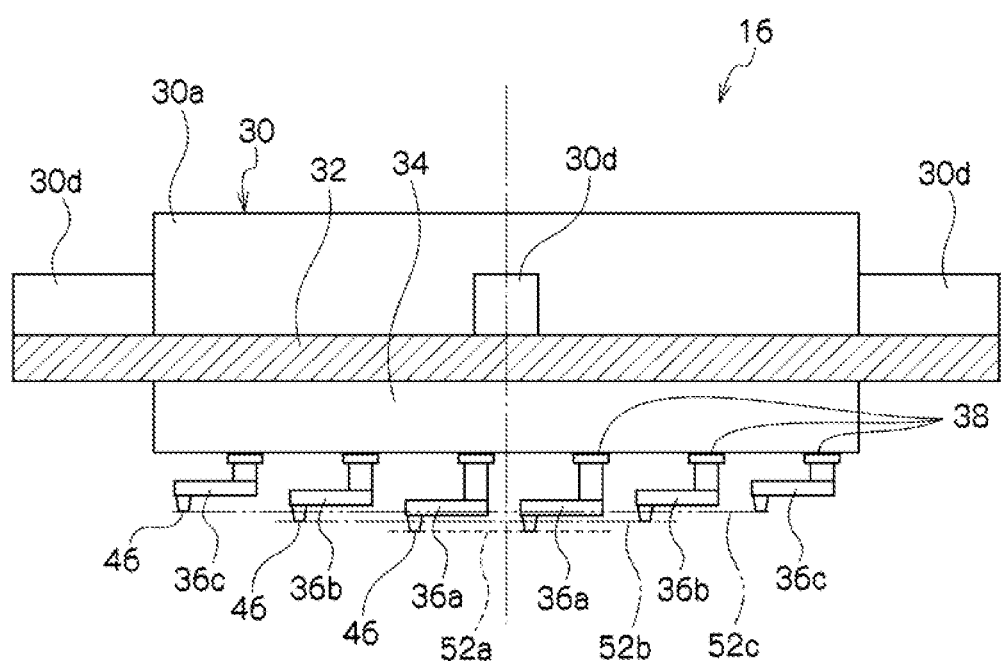
FIG. 2 shows a first embodiment of the electrical connecting apparatus.

Referring to FIGS. 1 and 2, the test apparatus 10 comprises an inspection stage 14, an electrical connecting apparatus 16, a test head 18 which exchanges the test signals with the integrated circuits in the wafer 12 through the connecting apparatus 16, and an annular card holder for attaching the connecting apparatus 16 to the test apparatus 10.

The inspection stage 14 has a chuck top 22 for receiving the wafer 12 on the upside and releaseably holding the wafer 12 vacuum-wise, and a stage moving mechanism 24 for moving the chuck top 22. The stage moving mechanism 24 may be a known moving mechanism which moves the chuck top 22 three-dimensionally in three directions of X, Y and Z within a horizontal plane and angularly rotates the chuck top 22 about a θ-axis extending in the Z-direction.

As shown in FIGS. 1 and 2, the connecting apparatus 16 includes a reinforcing member 30 having a flat underside, a circular flat plate-like wiring board 32 held on the underside of the reinforcing member 30, a probe base plate 34 disposed on the underside of the wiring board 32, and a plurality of contacts 36 (36a, 36b, 36c) arranged on the underside of the probe base plate 34.

The reinforcing member 30 may be made of a metal material such as a stainless steel plate (see, e.g., JP Patent Appln. Public Disclosure No. 2008-145238), which is incorporated by reference.

Such a reinforcing member 30 has an outer annular portion 30a (see FIG. 2), an inner attachment portion (not shown) circumferentially extending inside the annular portion 30a, a plurality of joint portions (not shown) which join the annular portion 30a and the attachment portion integrally, and a plurality of extensions 30d (see FIG. 2) extending radially outward from the annular portion.

The thickness dimension of the annular portion 30a or a section inward of the annular portion 30a may be larger than that of the extension 30d. Thus, the reinforcing member 30 is shown such that the inward section from the annular portion 30a, which has approximately the same diameter as the probe base plate 34, is projected upward.

As described, for example, in the Patent Gazette of JP Patent Appln. PD No. 2008-145238, which is incorporated by reference, it is possible to dispose on the upside of the reinforcing member 30 an annular thermal deformation inhibitor for controlling a thermal deformation of the reinforcing member 30, or a cover to cover a space above the wiring board, or to dispose the cover on the thermal deformation inhibitor.

The wiring board 32 in the illustration may be conventional and made of an electrically insulating resin such as glass-epoxy resin in a circular shape. Such a wiring board 32 has on the upside outer rim portion a plurality of terminals (not shown) to be electrically connected to the test head 18 so as to exchange test signals with the test head 18. The number of the terminals provided may be the same as that of the conductive paths.

The probe base plate 34 may be any one of a ceramic base plate, a flexible multilayer sheet made of an electrically insulating resin such as polyimide resin, and a combined board having a multilayer sheet provided on the underside of the multilayer ceramic base plate (not shown).

The probe base plate 34 such as above has a plurality of electrically connected internal wires in the conductive paths of the wiring board 32 as well as a plurality of probe lands 38 (see FIG. 2) electrically connected to those internal wires.

The numbers, respectively, of both the internal wires and the probe lands 38 may be the same as the number of the contacts 36.

The reinforcing member 30 and the wiring board 32 may be coaxially joined with a plurality of screw members (not shown) such that the underside of the reinforcing member 30 and the upside of the wiring board 32 about each other. On the other hand, the probe base plate 34 may be attached to the underside of the wiring board 32 such that the contacts 36 are placed downward by using an arbitrary attaching member and a plurality of screw members.

It is possible to dispose an electrical connector between the wiring board 32 and the probe base plate 34 to electrically connect the conductive paths of the wiring board 32 and the internal wirings of the probe base plate by the electrical connector. An example of such an electrical connector is disclosed, for example, in JP Patent Appln. PD No. 2008-145238, which is incorporated by reference.

Figure 3:
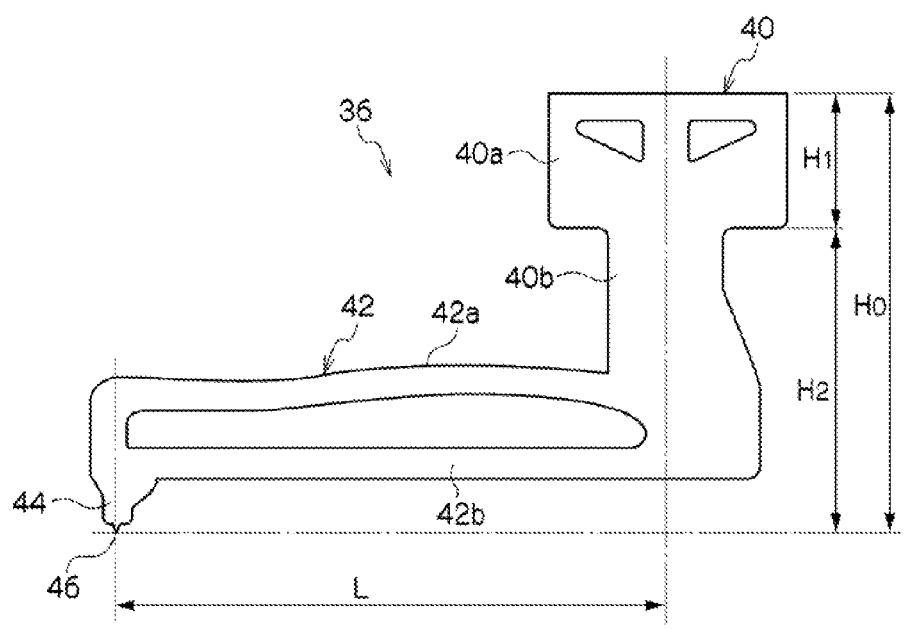
FIG. 3 shows an embodiment of a contact to be used in an embodiment of an electrical connecting apparatus.

An embodiment of each contact 36, as shown in FIG. 3, includes an attaching region 40 extending vertically, an arm region 42 extending in the horizontal direction intersecting the extending direction from the lower portion of the attaching region 40, and a tip region 44 extending downward from the front end portion of the arm region 42.

The attaching region 40 is provided with an attachment portion 40a to be attached to the underside of the probe base plate 34, and an extension 40b extending downward from the attachment portion 40a. The arm region 42 has a pair of arm portions 42a, 42b extending from the lower end portion of the extension 40b. The lower end portion of the tip region 44 has a cross-sectional area reduced toward the lower end side, and its lower end is formed as a tip 46 to be pressed against an electrode of the integrated circuit of the wafer 12.

Each contact 36 is cantilevered on the probe land 38 at the upper end portion of the attachment portion 40a such that the tip 46 is projected downward by jointing by a technique of conductive joining with a material such as soldering or welding by laser.

Each contact 36 has a height dimension H0 from the upper end of the attachment portion 40a to the tip 36, a height dimension H1 of the attachment portion 40a, a height dimension H2 of the extension 40b, and a dimension L between the center of the attachment portion to the probe land 38 and the tip 36.

Though the illustration only shows the contact 36, actually more than 20,000 contacts 36 are provided in case where, for example, the semiconductor wafer 12 has a diameter of 300 mm.

The test head 18 may be vonvnetional, and may exchange test signals with the connecting apparatus 16, and may be provided with various electrical circuits electrically connected to the terminals of the wiring board 34. The test head 18 is disposed above the connecting apparatus 16.

The card holder 20 is supported on the frame of the test apparatus 10 and has a crank-shaped section so as to receive the connecting apparatus 16. The connecting apparatus 16 is received on the test head 18 at the outer rim portion of the wiring board 32 such that the probe base plate 34 becomes parallel to the chuck top 22 or the wafer 12 received on the chuck top 22.

The connecting apparatus 16 such as above may be configured as follows to reduce differences in distance from the wafer 12 to the tips 46 even if the probe base plate 34 is greatly curved such that its central portion becomes convex, e.g., convex upward.

In other words, in an embodiment, the contacts 36 are arranged in the circular region 48 (see FIG. 4) with the center 50 (see FIG. 4) of the probe base plate 34 as the center and the distances between an imaginary plane within the probe base plate, parallel to the probe base plate 34, and the tips 46 are made longer toward the contacts in a region nearer the center 50.

The foregoing imaginary plane may be a plane parallel to the chuck top 22, the upside of the wafer 12 received thereon, the top faces of them, and the like. Thus, the contacts in the region nearer the center 50 are at the higher positions from such a plane to the tips 46.

Figure 4:
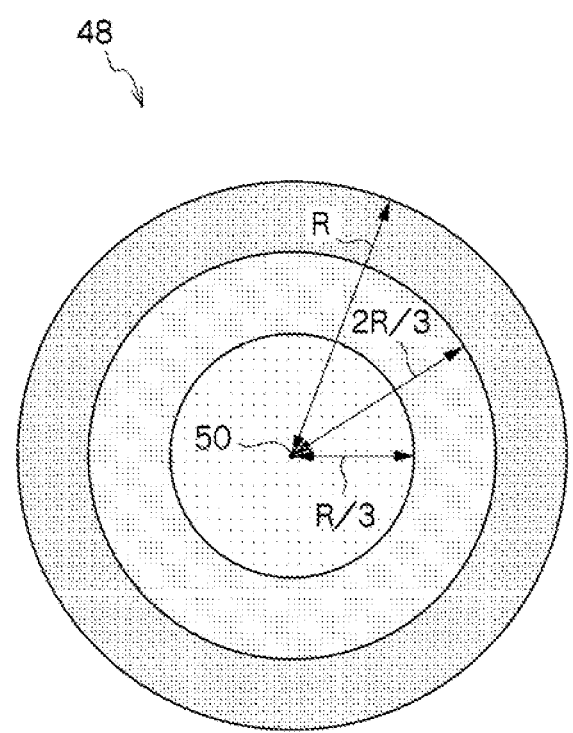
FIG. 4 is a view to explain a first embodiment of regions for arrangement of contacts.

As shown in FIG. 4, where the radius of the outermost region is R, the region 48 may include the first region from the center 50 to R/3, the second region 2R/3 in the intermediate position between R/3 and 2R/3, and the third region R outward around the second region 2R/3 between the 2/3R and R located at the outermost position.

In the example shown in FIG. 2, three kinds of contacts 36a, 36b, and 36c different in dimension H0 from the tips 46 to the upper ends of the attachment portions 40a may be used. Actually, the height dimensions H1 of the attachment portions 40a of those contacts may be changed. However, the dimensions H2 of the extensions 40b may also be changed.

The largest contact 36a in dimension H0 is located in the first region R/3 including the center 50, the second largest contact 36b in dimension H0 is located in the second region 2R/3, and the smallest contact 36a in dimension H0 is located in the third region R.

Accordingly, as shown in FIG. 2, the tip 46 of the contact 36a is located in the lowest imaginary plane 52a, the tip 46 of the contact 36b is located in the second lowest imaginary plane 52b, and the tip 46 of the contact 36c is located in the highest imaginary plane 52c. Thus, the height positions of the tips become lower in the order of the contacts 36a, 36b, 36c.

Figure 5:
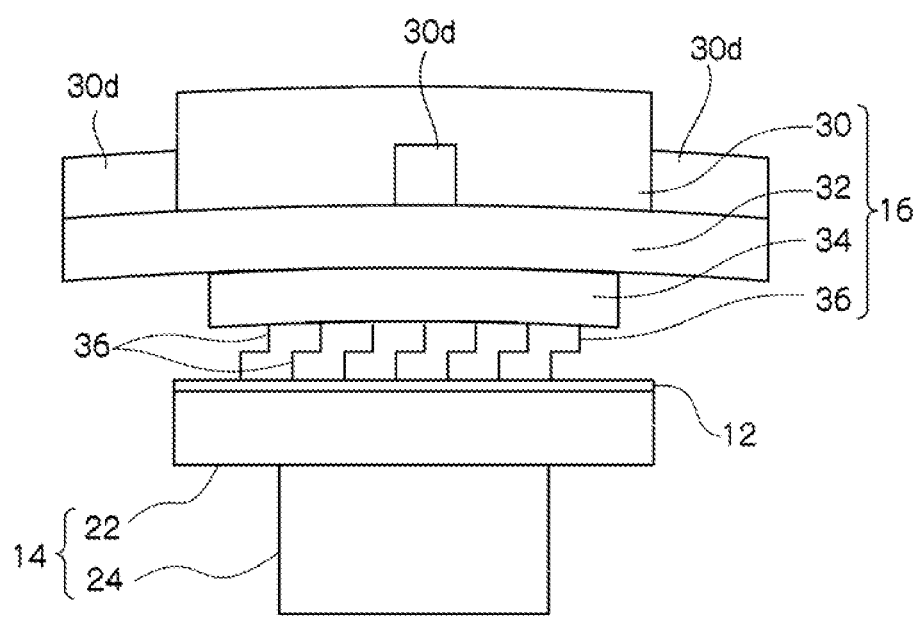
FIG. 5 shows a curved state of a probe base plate of an embodiment of the electrical connecting apparatus in FIGS. 1 and 2.

When testing, each contact is pressed against the electrode of the integrated circuit on the wafer 12 and is elastically deformed in its arm region 42. This may cause the wiring board 32, the probe base plate 34 and the like to bend, so that the central portion of the probe base plate 34 becomes convex upward as shown in FIG. 5.

In the connecting apparatus 16 such as above, the height positions of contacts from the imaginary plane, like the upside of the chuck top 22 below and the upside of the wafer 12 which is received on the chuck top 22, are lowered gradually or step-wise toward the contact located nearest to the center 50. Therefore, when the probe base plate 36 is largely curved such that the central portion becomes convex upward, the nearer the contacts are to the center 50, the more upward they are displaced, thereby reducing the differences in distance from the wafer 12 to the tips 46.

As a result, the tips 46 of the contacts 36 may more surely be pressed against the electrodes of the integrated circuit, the differences in the amount of slide relative to the electrodes may be significantly reduced, scrapes in the oxide film on the surfaces of the electrodes may more surely formed, thereby significantly reducing the differences in size of such scrapes.

Figure 6:
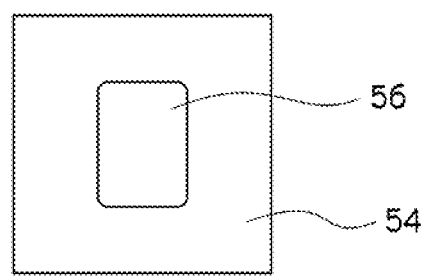
FIG. 6(A) shows a scrape made by an embodiment of an electrical connecting apparatus.
FIG. 6(B) shows a scrape made by a conventional electrical connecting apparatus.
Figure 6:
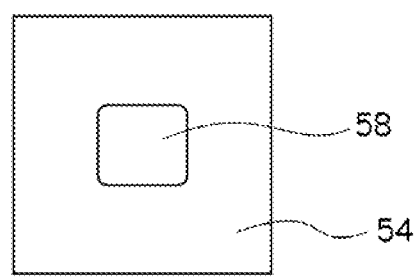

An example of a scrape by the probe base plate 34 is shown in FIG. 6(A) and a scrape by a conventional probe base plate, in FIG. 6(B). FIGS. 6(A) and (B) show examples of scrapes 56, 58 relative to the electrodes 54 of the integrated circuit located near the center 50.

As shown in FIG. 6(A), since the height positions of the tips have such a relationship as mentioned above, the scrape 56 by the probe base plate 34, may have at least a relatively large length dimension at least in the scraping direction even if the probe base plate 34 is curved as mentioned above. Consequently, the area and the depth dimension of the scrape are relatively large, and the scrape appears clearly.

On the contrary, since the tips 46 are at the same height positions, the scrape 58 by the conventional probe base plate shown in FIG. 6(B) may have a smaller length dimension in the scraping direction than the scrape 56 in FIG. 6(A). Consequently, the area and the depth dimension of the scrape may be small.

Thus, according to the probe base plate 34, contact positions of the tips to the electrodes marked by the scrapes when the connecting apparatus is attached to the test apparatus may be more accurately confirmed, and a more accurate test may become possible.

Figure 7:
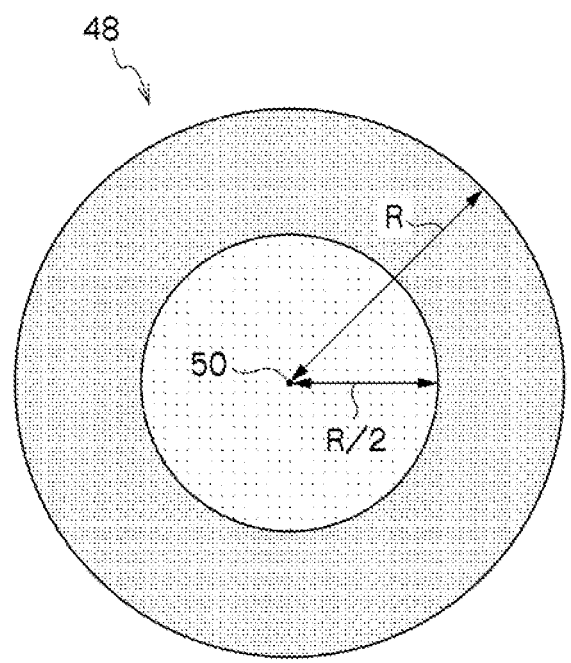
FIG. 7 explains a second embodiment of regions for arrangement of contacts.

As in the above embodiment, instead of placing the contacts 36 in any of the three regions, i.e., R/3, 2R/3 and R, it is possible to place the contacts 36 in either of the first region R/2 from the center 50 to R/2, and the second region R from the first region to R as shown in FIG. 7, or to place the contacts in any of the regions by forming four or more regions.

Also, the height positions of the tips 46 of the contacts 36 in each region may be the same if the nearer the center the contacts are, the higher the positions of the contacts become, or it is possible to make the contacts the larger toward the center 50.

Further, as means to change the height positions of the tips 46, instead of changing the dimensions H0, or in addition to the dimensions H0, the thickness dimensions of the probe land 38 may be changed. For example, the thickness dimensions of the probe lands 38 are selected to be greater toward the probe lands located nearer the center 50 of the probe base plate 34.

Figure 8:
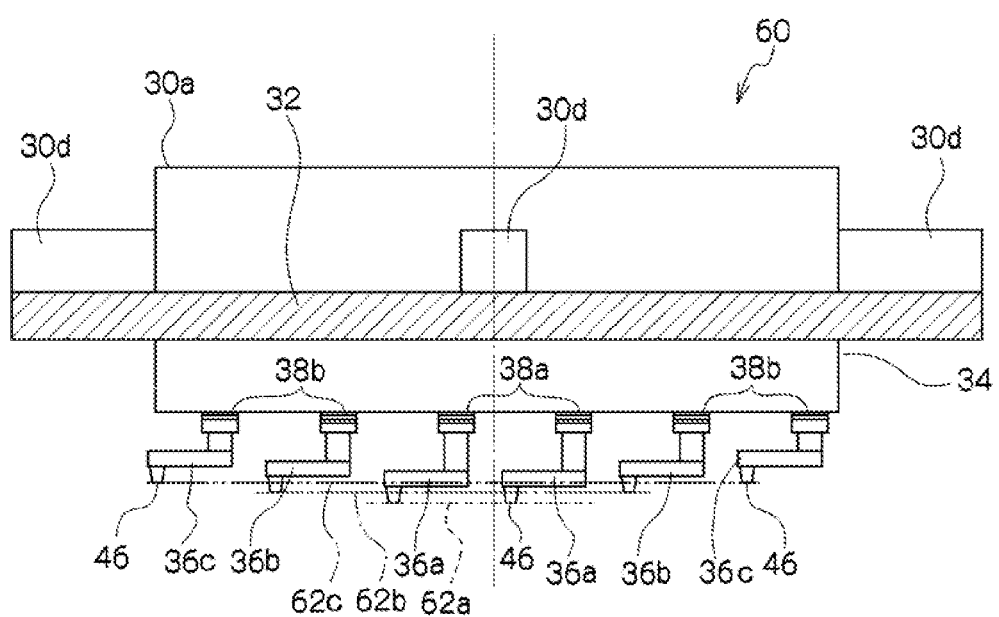
FIG. 8 shows a second embodiment of an electrical connecting apparatus.

Referring to FIG. 8, in the connecting apparatus 60, the thickness dimensions of the probe lands 38 are changed in addition to the dimension H0 in an embodiment.

Therefore, the connecting apparatus 60 uses three kinds of probe lands 38a, 38b, 38c different in thickness dimension, and three kinds of contacts 36a, 36b, 36c different in dimension H0 to change the height positions of the tips 46.

In the embodiment shown in FIG. 8, the contacts 36a, 36b, 36c are arranged in the first region R/3 which is from the center 50 of the probe base plate 34 to R/3 in FIG. 4, the second region 2R/3 which is around the first region R/3 and from 1/3R to 2/3R in FIG. 4, and the third region R which is around the second region 2R/3 and from 2/3R to R in FIG. 4.

The probe land 38a having the greatest thickness dimension and the contact 36a having the greatest dimension H0 are placed in the first region R/3. The probe land 38b having the second greatest thickness dimension and the contact 36b having the second greatest dimension H0 are placed in the second region 2R/3. The probe land 38b having the smallest thickness dimension and the contact 36c having the smallest dimension H0 are placed in the third region R.

Therefore, the tips 46 of the contacts 36c placed in the innermost first region R/3 are located in a low imaginary plane 62c, the tips 46 of the contacts 36b placed in the intermediate second region 2R/3 are located in the intermediate imaginary plane 62b, and the tips 46 of the contacts 36a placed in the outermost third region R are located in the intermediate imaginary plane 62a.

As a result, the connecting apparatus 60 may exhibit such a technical advantage as in the case of the above-mentioned connecting apparatus 16, because the height dimensions of the tips 46 from the imaginary plane below the tips are lowered gradually or step-wise toward the contacts 36 nearer the center 50.

In the embodiment of FIG. 8, the dimensions L of the contacts 36 (see FIG. 2) may be the same as the above, or may be made larger or smaller gradually or step-wise toward the contacts nearer the center of the probe base plate 34.

In the above embodiment, while the probe base plate 34 is attached to the wiring board 32, the wiring board 32 may be omitted, or the wiring board 32 attaching the probes to the wiring board 32, omitting the probe base plate 34, and using the wiring board 32 itself as the probe base plate.

The described matter is not limited to the above embodiments, and may be altered in various ways without departing from the spirit and scope presented here. Also, an alternative presented for one embodiment may be used in another embodiment even if not explicitly stated.

From the foregoing it will be appreciated that, although specific embodiments have been described herein for purposes of illustration, various modifications may be made without deviating from the spirit and scope of the disclosure. Furthermore, where an alternative is disclosed for a particular embodiment, this alternative may also apply to other embodiments even if not specifically stated.

The invention claimed is:

1. An electrical connecting apparatus comprising a probe base plate, and a plurality of contacts provided with tips to be pressed against electrodes of a device under test and arranged on an underside of said probe base plate, wherein the nearer the contacts are to a center of said probe base plate, the smaller are distance dimensions from an imaginary plane under the tips to the tips of said contacts, the imaginary plane being parallel to said probe base plate.

2. An electrical connecting apparatus claimed in claim 1, wherein said plurality of contacts are located in any one of a plurality of regions concentrically extending about said center, and
wherein said distance dimensions are smaller toward the contacts in the region nearer the center.

3. An electrical connecting apparatus claimed in claim 2, wherein said plurality of regions include a first region located nearest to the center, and a second region outward around said first region, and
wherein, where a radius of an outermost region is R, said first and second regions include ranges of R/2 and R/2 to R, respectively, from the center.

4. An electrical connecting apparatus claimed in claim 2, wherein said plurality of regions include a first region located nearest to the center, a second region outward around said first region, and a third region outward around said second region, and
wherein, where a diameter of an outermost region is R, said first, second and third regions include ranges of R/3, from R/3 to 2R/3, and 2R/3 to R, respectively, from the center.

5. An electrical connecting apparatus claimed in claim 1, wherein dimensions of said contacts from attachment positions thereof to the probe base plate become the greater, the nearer the center of said probe base plate the contacts are located.

6. An electrical connecting apparatus claimed in claim 1, wherein said probe base plate has a plurality of probe lands on the underside, said probe lands attaching said contacts, and
wherein, the nearer the center of said probe base plate said probe lands are, the greater thickness dimensions of said probe lands become.

7. An electrical connecting apparatus claimed in claim 1, wherein said probe base plate has on its underside a plurality of probe lands to each of which said contact is attached,
wherein, the nearer said probe lands are to the center of said probe base plates, the greater thickness dimensions of said probe lands become, and wherein, the nearer to the center of said probe base plates said probe lands are, dimensions from attachment positions of said contacts to said probe base plate become greater.

8. An electrical connecting apparatus claimed in claim 1, wherein a radius dimension of an outermost region is 200 mm or over.

9. An electrical connecting apparatus claimed in claim 1, wherein each contact is cantilevered on said probe base plate.

10. An electrical connecting apparatus claimed in claim 1, wherein each contact includes an attachment region attached to said probe base plate in a state of extending downward from said probe base plate, an arm region extending in a direction intersecting the extending direction of said attachment region from a lower portion of said attachment region, and a tip region extending downward from a front end portion of said arm region,
wherein said tip is a lower end of said tip region.

11. A probe assembly, comprising:
a base plate;
a first contact protruding from a first region of the base plate and having a dimension of a first size, a tip of said first contact contacting a device under test; and
a second contact protruding from a second region of the base plate and having the dimension of a second size, a tip of said second contact contacting the device under test,
wherein the dimensions are distances from said base plate to the tip of each contact and the dimensions of the first size is greater than the second size.

12. The probe assembly of claim 11 wherein:
the base plate has a mid region;
the first region is a first distance from the mid region; and
the second region is a second distance from the mid region.

13. The probe assembly of claim 11 wherein:
the base plate has a center;
the first region is a first radial distance from the center; and
the second region is a second radial distance from the center.

14. The probe assembly of claim 11 wherein:
the base plate has a surface and a mid region;
the first region is a first distance from the mid region;
the second region is a second distance from the mid region, the second distance greater than the first distance; and
the dimension is approximately perpendicular to the surface of the base plate.

15. The probe assembly of claim 11 wherein:
the first region includes a center region of the base plate; and
the second region being remote from the center region.

16. The probe assembly of claim 11 wherein:
the base includes a center;
the first region includes the center and has a boundary that is a first radial distance from the center; and
the second region is concentric with the first region and has a boundary that is a second radial distance from the center, the second radial distance being greater than the first radial distance.

17. The probe assembly of claim 11 wherein:
the base plate has a surface;
the first region includes a mid region of the base plate;
the second region is remote from the mid region;
the dimension is approximately perpendicular to the surface of the base plate; and
the first size is greater than the second size.

18. A test head, comprising:
a wiring board having first and second conductive paths; and
a probe assembly, including:
a base plate;
a first contact protruding from a first region of the base plate, having a dimension of a first size, and coupled to the first conductive path; and
a second contact protruding from a second region of the base plate, having the dimension of a second size, and coupled to the second conductive path,
wherein the dimensions are distances from said base plate to the tip of each contact and the dimensions of the first size is greater than the second size.

19. A test system, comprising:
a test head operable to provide a signal to and receive a signal from at least one integrated circuit, the test head including:
a wiring board having first and second conductive paths; and
a probe assembly, including:
a base plate;
a first contact protruding from a first region of the base plate, having a dimension of a first size, coupled to the first conductive path, and operable to press against a first node of the at least one integrated circuit; and
a second contact protruding from a second region of the base plate, having the dimension of a second size, coupled to the second conductive path, and operable to press against a second node of the at least one integrated circuit; and
a chuck operable to hold the at least one integrated circuit for engagement with the test head,
wherein the dimensions are distances from said base plate to the tip of each contact and the dimensions of the first size is greater than the second size.

* * * * *